United States Patent [19]

Sedlacek

[11] 4,047,815

[45] Sept. 13, 1977

[54] MEASUREMENT OF STANDARD VISUAL RANGE

[75] Inventor: Herbert Sedlacek, Hamburg, Germany

[73] Assignee: Licentia Patent-Verwaltungs-G.m.b.H., Frankfurt am Main, Germany

[21] Appl. No.: 620,911

[22] Filed: Oct. 8, 1975

[30] Foreign Application Priority Data

Oct. 10, 1974 Germany ............................ 2448274

[51] Int. Cl.² .......................................... G01N 21/00
[52] U.S. Cl. .................... 356/104; 356/206; 356/229; 250/565
[58] Field of Search ............... 356/104, 205, 206, 207, 356/229

[56] References Cited

U.S. PATENT DOCUMENTS

| | | | |
|---|---|---|---|
| 3,522,739 | 8/1970 | Coor et al. | 356/93 |
| 3,563,661 | 2/1971 | Charlson et al. | 356/104 |
| 3,879,135 | 4/1975 | Egli et al. | 356/206 |

Primary Examiner—Vincent P. McGraw
Attorney, Agent, or Firm—Spencer & Kaye

[57] ABSTRACT

For determining the standard visual range by determining the relation between a measured signal and a reference signal, the two signals are processed purely electronically by amplifying one of the signals in an amplifier having a digitally programmed amplification factor controlled by a digital value representing the computed range, forming a quotient between the output of the amplifier and the other of the signals, employing the resulting quotient value to adjust the amplifier amplification factor to a value representative of the standard visual range, and providing a digital output corresponding to the amplification factor.

6 Claims, 2 Drawing Figures

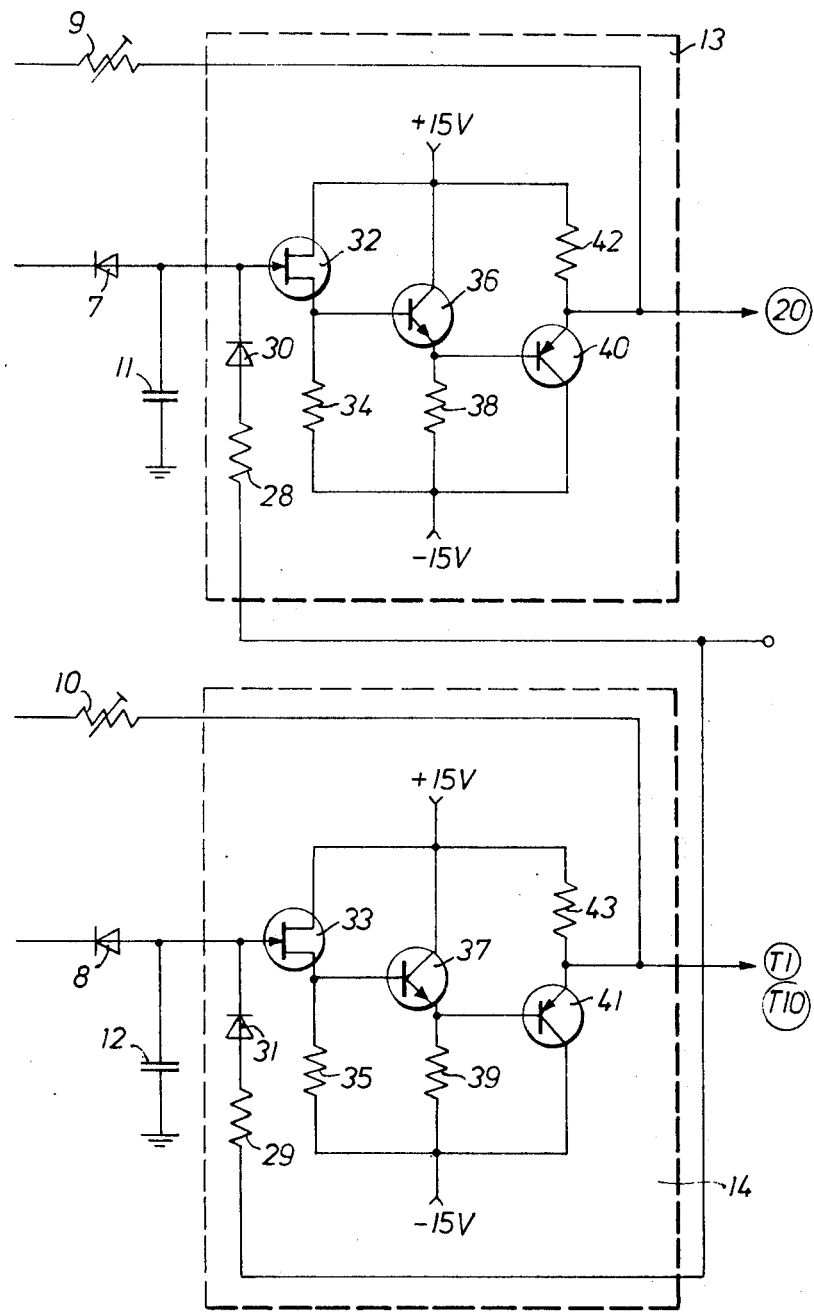

MEASUREMENT OF STANDARD VISUAL RANGE

BACKGROUND OF THE INVENTION

The present invention relates to measurement of the standard visual range, employing a measuring signal and a reference signal, and to a circuit arrangement therefor.

The visual range of any object which is disposed in front of or above the horizon is generally understood to be the distance up to which an observer with normal eyesight can still discern it. The value of such distance depends mainly on the clearness of the air, the ambient light conditions, and certain characteristics of the object and its environment and of the normal eye. The standard visual range, which is an accurate and long established indication of the visibility distance in the atmosphere, is physically clearly defined by the following formula:

$$V_N = \frac{3.91}{z}$$

where $V_N$ is the standard range and z is the atmospheric extinction coefficient. The units in which $V_N$ and z are expressed in the equation are km and km$^{-1}$, respectively 3.91 is a constant. The equation describes Koschmieder's theory.

Experience has shown that a beam of light is attenuated in the atmosphere mainly by the fact that the molecules of the air and the particles of the aerosol are scatter part of the light from the beam in all directions. Absorption is generally negligible and reaches the order of magnitude of scattering only in dense smoke or the like.

In practice the following is a good approximation of the standard visual range:

$$V_N = \frac{3.91}{b}$$

where $b$ is the coefficient of atmospheric scattering. The relation between the scattering coefficient which is desired to be measured and the scattered light which is measured is given by the scattering function $\beta'(\phi)$ which indicates the light intensity of the light scattered in the direction $\phi$ relative to its primary radiation direction. The scattering coefficient is then:

$$b = 2\pi \cdot \int_{0°}^{180°} \beta'(\phi) \sin\phi d\phi$$

It is known to determine the standard visual range, $V_N$, with the aid of transmissiometers or scattered light recorders. Generally a good visibility measuring instrument processes reference signals and measured signals and the standard visual range results from a multiplication of a calibrating factor K with the quotient of such a reference signal and measured signal.

Thus a scattered light recorder is known which is provided with a pulsed lamp which is triggered periodically and then produces an amount of scattered light in the scattering volume which amount is greater as the standard visual range is smaller. An optical device equipped with lenses collects part of this scattered light through a wedge filter on a photocell, to produce the measured signal. A small proportion of the primary pulsed light impinges on a second photocell, as comparison light, to produce the reference signal. This proportion can be varied with a compensating aperture and the scale of the instrument can be shifted with the aid of a standard calibration so that the measured standard visual ranges are indicated correctly.

The difference between the current pulses generated by the pulsed light in the photocells is amplified in an amplifier with high feedback and is then expanded in two expansion stages and integrated over a plurality of pulses. If the sum of the positive and negative polarity portions of the signal exceeds a given threshold value, which corresponds, for example, to a deviation of ±5% from the standard visual range being indicated, an electrical gate is enabled for the corresponding control current of a servo motor. The servo motor then regulates the wedge filter so that the pulse difference at the input is reduced to an amount which corresponds to a threshold value $< \pm 5\%$. The position of the calibrated wedge filter, which is transmitted by a remote sensor to a recording instrument, is then a measure for the standard visual range. It is indicated on a logarithmic scale.

This scattered light recorder, when used with a servo system, exhibits an unavoidable and often undesirable time constant in the indication. The analog output also permits transmission of the measured values or transfer to digital process controls only after complicated analog-digital conversion of the measured value.

SUMMARY OF THE INVENTION

It is therefore an object of the present invention to measure the standard visual range by using a measured signal and a refence signal, in a manner which renders servo systems superfluous and which practically eliminates time delays.

These and other objects are accomplished, according to the present invention, by feeding the reference signal and the measured signal to a circuit arrangement which forms the quotient of the reference signal and the measured signal with the aid of a digitally programmable amplifier controlled by a calibration factor and by obtaining an indication of the standard visual range in the form of digital signals from the output of the circuit arrangement. According to a further embodiment of the invention, either the measured signal alone or the measured signal and the reference signal are obtained from an electrooptical device.

Generating the measuring signal as well as the reference signal in an electro-optical device has the advantage that a change in the characteristics of the instrument due to mechanical and environmental influences will have no influence on the measuring result. A further advantage of the present invention, in addition to the immediate determination of the standard visual range, is that the measuring result is available at the circuit output in the form of digital signals. This makes further processing of the value measured for the standard visual range very easy.

The circuit arrangement according to the present invention is distinguished in that it is arranged so that the reference signal is fed to the input of a comparator, via a differential amplifier, a diode, a capacitor serving as an analog memory, and an impedance converter having a feedback resistor with two possible settings for a defined reference signal; the measured signal is fed to the second input of a comparator, via a differential amplifier, a diode, a capacitor serving as an analog memory, and an impedance converter with feedback resistance for the purpose of setting a given calibration factor, the amplification factor being settable with the aid of a further amplifier utilizing iterative networks, feedback resistors and semiconductor switches which are controlled by a counter; the comparator determines the standard visual range by a comparison of its input signals and provides them in digital form; and the digital signals are fed by the counter in BCD code to a store and can be read from a display device which is connected in series with the store. Potentiometers may be provided to set the calibration factor or to set the defined reference signal, respectively, which potentiometers are disposed in the feedback branch between the output of the impedance converter and the second input of the differential amplifier. The proposed circuit arrangement is advantageously also distinguished by a relatively small space requirement and low manufacturing costs.

According to one embodiment of the present invention, a rectangular wave generator is provided to produce a rectangular signal to control the counter, and the circuit is synchronized by the pulsed lamp control itself. With this signal the counter and thus the circuit arrangements can be set to a defined output state.

BRIEF DESCRIPTION OF THE DRAWING

FIG. 2 is a circuit arrangement of a preferred embodiment of the impedance converters, which are shown in FIG. 1.

DESCRIPTION OF THE PREFERRED EMBODIMENTS

Figure 1:
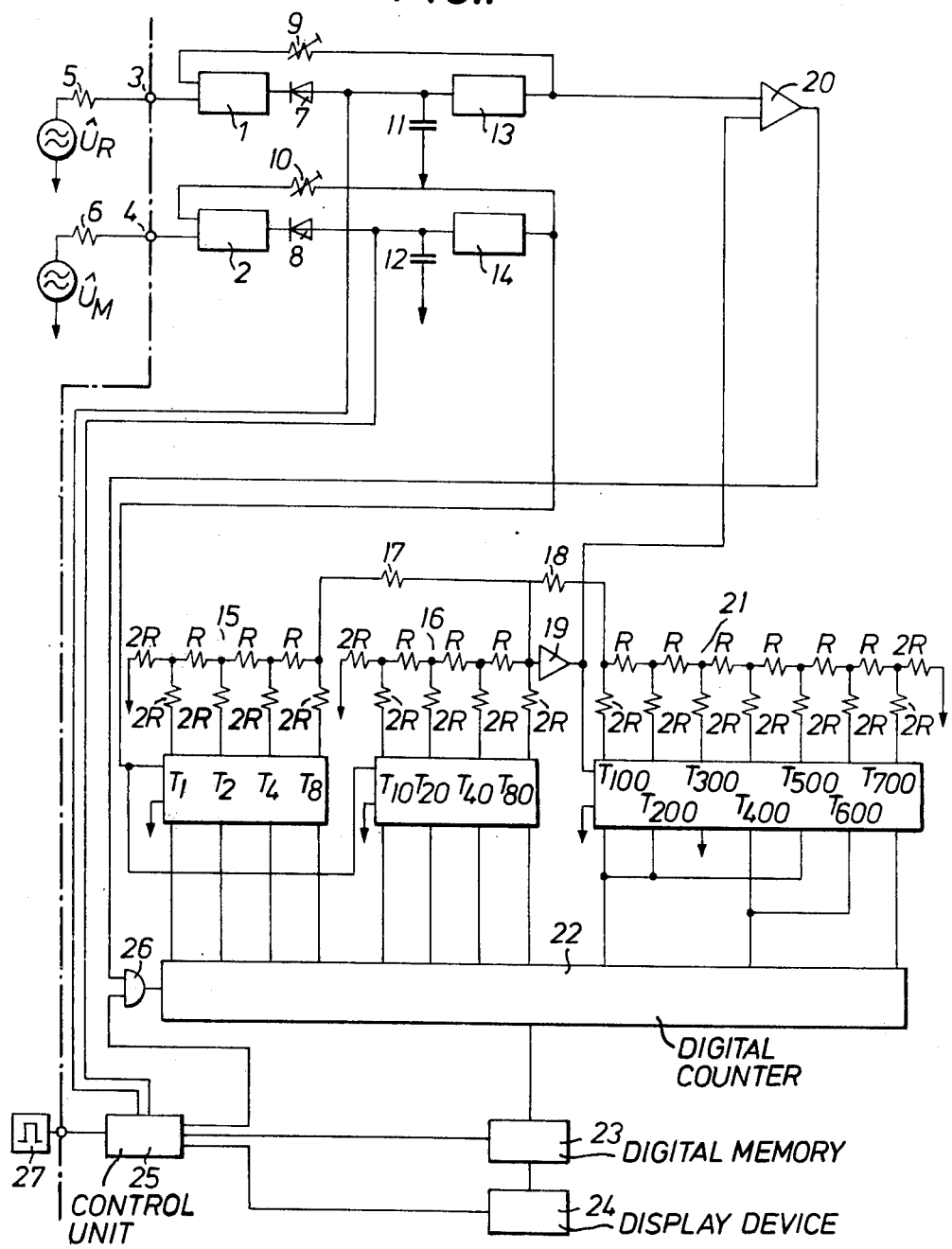
FIG. 1 is a block circuit diagram of a preferred embodiment of a circuit arrangement according to the invention.

The input terminals of the circuit arrangement shown in FIG. 1 are constituted by one input of each of two differential amplifiers 1 and 2, these being the input 3 of amplifier 1 and input 4 of amplifier 2. The reference signal $U_R$ is applied from a voltage source having an internal resistance 5 to terminal 3 and the measured signal $U_M$ is applied to terminal 4 from a voltage source having an internal resistance 6.

The output of differential amplifier 1 is connected directly, via a diode 7, a capacitor 11 serving as an analog signal store, and an impedance converter 13, to one input of a comparator 20. A variable resistance 9 is connected in a feedback branch between converter 13 and amplifier 1 in order to permit the setting of a defined signal.

The output of the differential amplifier 2 is connected directly, via a diode 8, a capacitor 12 serving as an analog signal store, and an impedance converter 14, with series-connected iterative networks 15, 16 and 21 and a further amplifier 19. The amplifier 19 has iterative networks connected to both its input and output and is provided with feedback resistors 17, 18. The output of amplifier 19 is connected to the second input of comparator 20 in order to provide a sliding decimal point display for the standard visual range. A variable resistor 10 is connected in a feedback branch between converter 14 and amplifier 2 to permit setting of a calibration factor.

Networks 15 and 16 are associated with semiconductor switches, which can be C-MOS transistors, T1, T2, T4, T8 and T10, T20, T40, T80 which are each either at electrical 0 or connected to the output of the impedance converter 14, depending on the matching state of the members of the iterative networks 15 and 16, while the total feedback of amplifier 19 is set by means of iterative network 21, semiconductor switches T100 - T700 associated therewith and the fixed feedback resistance 18.

Semiconductor switches T1 to T700 are controlled by a digital counter 22, semiconductor switches T1, T2, T4 and T8 being associated with the unit digits of a digital display unit 24 and semiconductor switches T10, T20, T40 and T80 with the tens digits of the digital display 24 for the standard visual range.

Semiconductor switches T100 or T700 are associated with the position of the decimal point in that, for example, if T100/T200/T500 are addressed, the decimal point appears on the "left" of the display in device 24, if T400/T600 are addressed the decimal point appears at the "center," and if T700 is addressed, the decimal point appears at the "right" of the display. The circuit arrangement formed of the iterative network 15, 16 and 21, amplifier 19, feedback resistances 17 and 18 and semiconductor switches T1 to T700 ultimately constitutes a digitally adjustable amplifier with the following transfer function:

$$-V_{Dig} = \left[ \frac{2^{-n}}{1+\alpha} \sum_{i=1}^{n} Q_i \cdot 2^{n-i} + \frac{2^{-m}}{1+\beta} \sum_{j=1}^{m} Q_j \cdot 2^{n-j} \right] \frac{1+\gamma}{2^{-k}} \frac{1}{\sum_{i=1}^{k} Q_i \cdot 2^{k-p}},$$

where $n$, $m$ and $k$ represent the number of the stage in the tens, unit and sliding decimal point iterative networks; $i$, $j$ and $p$ represent the BCD signal present at that particular time and $\alpha$, $\beta$ and $\gamma$ represent the decade evaluation coefficients. The decade evaluation coefficients are pure figures, e.g. assume $\alpha = 0$, $\beta = 9$, and $\gamma = 24$ can be associated. If one uses at the same time $n = 4$, $m = 4$ and $k = 7$, and Q, in dependence of the applied BCD-signals, assuming either the value 0 or 1, then by point by point evaluation of the equation the connection between the indication, the amplification and the BCD-counter capacity is evident, $V_{Dig}$ is therefore a pure figure before a calibration factor is assigned.

The output of comparator 20 is connected with one input of an AND gate 26 whose second input is fed by a control unit 25. The output of AND gate 26 is directly conductively connected to counter 22 while the output of counter 22 is electrically connected to display device 24 via a digital memory 23. The display device may be, for example, a 7-segment-digital.

The control unit 25 is preferably synchronized from the pulsed lamp circuit and controls all processes such as resetting the counter to 0, transferring the counter state upon completion of matching to the memory, and discharging the memory capacitors 11 and 12 upon completion of matching in order to be ready for the next periodic measurement which is initiated by the next synchronizing pulse from a rectangular wave generator 27.

The control unit 25 further includes two rectangular wave generators one of which furnishes counting pulses which are applied to the second input of AND gate 26 and the other of which periodically switches on and off the supply voltage for the 7-segment-digital display 24. Periodic blinking of the display can signal a state outside of the measuring range. Measured values below this range are detected and even a single counting pulse suffices to actuate comparator 20 while measured values above the measuring range produce overrunning of counter 22.

The process for determining the standard visual range according to the invention will be described below with reference to the embodiment which is illustrated in the drawing. The reference signal $u_R$ travels via differential amplifier 1, diode 7 and capacitor 11 to impedance converter 13. At the first input of comparator 20 there this is present the voltage $$U_R = K_1 \cdot \hat{u}_R$$

where $\hat{u}_R$ is the peak value of the pulse to be processed and $K_1$ is a calibration factor for the reference signal. The measured signal, $u_M$ is fed, via differential amplifier 2, diode 8 and capacitor 12 to impedance converter 14, and the signal from converter 14 is supplied to the digitally adjustable amplifier according to the previously stated transfer function, the amplification being adjusted via semiconductor switches T1 to T700. At the second input of comparator 20 there thus is present the voltage $$U_M = K_2 \cdot \hat{u}_M \cdot V_{Dig}$$

where $\hat{u}_M$ represents the peak value of the measured signal, $K_2$ is a calibration factor and $V_{Dig}$ is the standard visual range in the form of digital signals. Comparator 20 determines the standard visual range $V_{dig}$ by a comparison of the input signals $U_M$ and $U_R$, as follows:

$$V_{Dig} = \frac{K_1 \cdot \hat{u}_R}{K_2 \cdot \hat{u}_M} = K \cdot \frac{\hat{u}_R}{\hat{u}_M}.$$

This condition is always met if after periodic counting up of counter 22 and thus increase in amplification $V_{Dig}$, comparator 20 and AND gate 26 permit no further counting pulses from control unit 25 to pass.

The standard visual range $v_{Dig}$ is now transmitted in BCD code from counter 22 to memory 23 and then is displayed in display device 24. In the illustrated embodiment, the calibration factor K is $$\frac{K_1}{K_2}$$

In order to be able to fully utilize the exact operating range of comparator 20 it is advisable for signal $U_R$ to be set to a certain value in comparator 20 by means of variable resistor 9 when the apparatus is initially calibrated. It is similarly advisable to precisely set the calibration factor K by means of variable resistor 10.

The calibration factor K thus assures the proper association of the digital output value with the actually present input signals $\hat{u}_R$ and $\hat{u}_M$, which are advantageously furnished by an electro-optical device.

FIG. 2 shows the wiring diagrams of the impedance converters 13 and 14 and its wiring with the variable resistors 9 and 10, the diodes 7 and 8, the capacitors 11 and 12, the comparators 20 and the semiconductor switches $T_1$ and $T_{10}$. Both impedance converters 13 and 14 are equipped with the same electronic components and are connected with each other through two resistors 28 and 29 and two dioes 30 and 31. The resistors 28 and 29 are lead at the same time to the shielding of the circuit arrangement.

Each impedance converter is provided with a field effect transistor 32 or 33, respectively, whose gate connections are interconnected with the diodes 7 or 8 and 30 or 31 and the capacitors 11 or 12. Parallel to the drain-source paths of the field effect transistors 32 or 33 and the source resistances 34 or 35 are arranged the emitter-collector paths of a NPN-transistor 36 or 37 and a emitter resistor 38 or 39 as well as the emitter-collector path of a PNP-transistor 40 or 41 and a emitter-resistor 42 or 43. The NPN-transistors 36 and 37 are controlled by the source connections of the field effective transistors 32 or 33, whereas the basis of the PNP transistors 40 or 41 are controlled by the emitters of the NPN-transistors 36 or 37. The emitter of the transistor 40 is lead to the variable resistor 9 and to the input of the comparator 20. The emitter of the transistor 41 is electrically conductible connected with the variable resistor 10 and the semiconductor switches $T_1$ and $T_{10}$.

For all semiconductor switches as well as for most other components, integrated components of FIG. 1 of RCA can be used which are listed in the catalogue of this company "Integrated Digital Circuits" Solid State COS/MOS, annual set 1973. Therefore, instead of the semiconductor switches, $T_1$ to $T_8$ and $T_{10}$ to $T_{80}$ or $T_{100}$ to $T_{700}$ one or two respective module units CD 4016 can be used. Consequently the digital counter 22 can consist of two components CD 4029, the digital memory 23 of two components CD 4042 and the control unit 25 of a component CD 4011, a component CD 4013 and three components CD 4001. The display service 24 on the other hand can have two integrated switching circuits of "Monsanto,"Type MAN 72 and the rectangular wave generator 27 two unijunction transistors, for example Type 2N 2646 of "General Electric".

It will be understood that the above description of the present invention is susceptible to various modificatiions, changes and adaptations, and the same are intended to be comprehended within the meaning and range of equivalents of the appended claims.

What is claimed is:

1. In apparatus for use in a system producing pulses of light and introducing the light into a scattering volume where the light is scattered, which apparatus serves to determine the standard visual range in an atmosphere corresponding to the scattering volume, and includes electro-optical measured signal producing means connected for monitoring the light scattered in the scattering volume and producing a measured signal representative of the amount of scattering, means for producing a reference signal, and comparator means having two inputs and an output, the improvement wherein said apparatus further comprises:

means connecting one input of said comparator means to one of said signal producing means;

variable-gain amplifier means connected between the other of said signal producing means and the other input of said comparator means for applying to said other comparator means input a signal whose value is a function of the signal produced by said other signal producing means and the gain of said amplifier means;

gain adjusting means connected to said amplifier means and arranged to be controlled by digital signals for adjusting the gain of said amplifier means in response to such digital signals;

digital counter means connected between the output of said comparator means and said gain adjusting means for performing a counting operation under control of the signal at the output of said comparator means and for supplying to said gain adjusting means signals representing its digital state and constituting the digital signals controlling said gain adjusting means; and indicator means connected to said counter means for providing a visible indication of the count state of said counter means.

2. An arrangement as defined in claim 1 wherein: said means connecting one input of said comparator means to one of said signal producing means comprise a first series circuit of an amplifier, a diode, a capacitor constituting an analog memory and a first impedance converter, and a first adjustable feedback resistance connected in feedback with said first series circuit, an input of said amplifier being connected to said one of said signal producing means and the output side of said first impedance converter being connected to the one input of said comparator means; said apparatus further comprises a second series circuit of an amplifier having an input connected to said other of said signal producing means to receive the signal therefrom, a diode, a capacitor constituting an analog memory and a second impedance converter having its output side connected to the input of said variable-gain amplifier means; a second adjustable feedback resistance connected in feedback with said second series circuit; said gain adjusting means comprise iterative network means presenting adjustable impedances whose values determine the gain of said variable-gain amplifier means, feedback resistances connected between said iterative network means and said variable-gain amplifier means, and semiconductor switch means connected between said network means and said counter means for adjusting the values of said impedances of said network means in response to the digital state of said counter means; and said indicator means comprise digital memory means connected to receive and store a binary coded decimal signal corresponding to the digital state of said counter means.

3. An arrangement as defined in claim 2 wherein said amplifier of said first series circuit is a differential amplifier having one input connected to said reference signal producing means and said first adjustable feedback resistance comprises a potentiometer connected between the output side of said first impedance converter and the other input of said differential amplifier of said first series circuit and settable to a selected resistance value for establishing a selected reference signal.

4. An arrangement as defined in claim 3 wherein said amplifier of said second series circuit is a differential amplifier having one input connected to said measured signal producing means and said second adjustable resistance comprises a potentiometer connected between the output side of said second impedance converter and the other input of said differential amplifier of said second series circuit and settable to a selected resistance value for establishing a selected calibration factor.

5. An arrangement as defined in claim 2 further comprising: an AND gate having a first input connected to the output of said comparator to receive an enabling signal and an output connected to said counter, said gate further having a second input; and a rectangular wave generator connected to supply signal pulses to said second gate input to control the operation of said counter means and arranged to be synchronized with the pulses of light.

6. An arrangement as defined in claim 1 wherein said reference signal producing means comprise an electro-optical device.

* * * * *